United States Patent
Chen et al.

(10) Patent No.: US 12,404,602 B2
(45) Date of Patent: Sep. 2, 2025

(54) APPARATUS FOR SYNCHRONOUS GROWTH OF SILICON CARBIDE CRYSTALS IN MULTIPLE INDEPENDENT CRUCIBLES ARRANGED LINEARLY

(71) Applicant: SUZHOU UKING PHOTOELECTRIC TECHNOLOGY CO., LTD., Suzhou (CN)

(72) Inventors: Jianming Chen, Suzhou (CN); Yuanhui Zhou, Suzhou (CN); Hongyu Yang, Suzhou (CN)

(73) Assignee: SUZHOU UKING SEMICONDUCTOR TECHNOLOGY Co., Ltd., Suzhou (CN)

( * ) Notice: Subject to any disclaimer, the term of this patent is extended or adjusted under 35 U.S.C. 154(b) by 71 days.

(21) Appl. No.: 18/156,885

(22) Filed: Jan. 19, 2023

(65) Prior Publication Data
US 2023/0151511 A1    May 18, 2023

Related U.S. Application Data

(63) Continuation of application No. PCT/CN2022/124446, filed on Oct. 10, 2022.

(30) Foreign Application Priority Data

Nov. 15, 2021 (CN) .......................... 202111349816.1

(51) Int. Cl.
*C30B 35/00* (2006.01)
*C30B 23/00* (2006.01)
(Continued)

(52) U.S. Cl.
CPC .......... *C30B 23/002* (2013.01); *C30B 23/025* (2013.01); *C30B 23/066* (2013.01); *C30B 29/36* (2013.01)

(58) Field of Classification Search
CPC ....... C30B 23/00; C30B 23/002; C30B 23/02; C30B 23/025; C30B 23/06; C30B 23/066;
(Continued)

(56) References Cited

U.S. PATENT DOCUMENTS 6,652,649 B1    11/2003   Hearst et al.
10,793,972 B1   10/2020   Xu et al.
(Continued)

FOREIGN PATENT DOCUMENTS

CN    104364428 A    2/2015
CN    105525352 A    4/2016
(Continued)

OTHER PUBLICATIONS

Zhengping Zhao et al. "Wide band gap semiconductor high frequency and microwave power devices and circuits", National Defense Industry Press, Dec. 31, 2017, pp. 47-48, 1st edition.
(Continued)

*Primary Examiner* — Kenneth A Bratland, Jr.

(57) ABSTRACT

The present application discloses a method and apparatus for synchronous growth of silicon carbide crystals in multiple crucibles comprising a chamber and an insulation layer assembly arranged close to inner walls of the chamber wherein the insulation layer assembly is used to divide the chamber into a plurality of independent growth cavities, and each of the growth cavities is provided with an independent growth assembly; wherein the independent growth assembly comprises a graphite crucible, a seed crystal tray arranged on the top of the graphite crucible and a drive assembly arranged at the bottom the crucible.

15 Claims, 4 Drawing Sheets

(51) Int. Cl.
*C30B 23/02* (2006.01)
*C30B 23/06* (2006.01)
*C30B 29/36* (2006.01)

(58) Field of Classification Search
CPC ......... C30B 29/00; C30B 29/10; C30B 29/36; C30B 35/00; C30B 35/002
USPC ............... 117/84, 88, 200, 204, 937, 951
See application file for complete search history.

(56) References Cited

U.S. PATENT DOCUMENTS

| | | | |
|---|---|---|---|
| 2013/0320275 | A1 | 12/2013 | Zwieback et al. |
| 2015/0361580 | A1 | 12/2015 | Huang et al. |

FOREIGN PATENT DOCUMENTS

| | | | | |
|---|---|---|---|---|
| CN | 110129880 | A | 8/2019 | |
| CN | 210194036 | U | 3/2020 | |
| CN | 210287583 | U | 4/2020 | |
| CN | 111624460 | A | 9/2020 | |
| CN | 113502531 | A | 10/2021 | |
| CN | 113502541 | A | 10/2021 | |
| CN | 114000198 | A | 2/2022 | |
| DE | 102020111456 | A1 | 10/2021 | |
| JP | 6459406 | B2 | 1/2019 | |
| KR | 20110080527 | A | 7/2011 | |
| KR | 20170013668 | A * | 2/2017 | |
| KR | 20170034812 | A | 3/2017 | |
| RU | 2155829 | C2 | 9/2000 | |
| WO | WO-2021217191 | A1 * | 11/2021 | ........... C30B 11/002 |

OTHER PUBLICATIONS

International Search Report dated Dec. 16, 2022 for International Application No. PCT/CN2022/124446.
Rejection Decision dated Aug. 24, 2022 from National Intellectual Property Administration, PRC for CN Application No. 202111349816.1.
Reexamination Decision dated Dec. 20, 2022 from National Intellectual Property Administration, PRC for CN Application No. 202111349816.1.
The first Office Action dated May 10, 2022 from National Intellectual Property Administration, PRC for CN Application No. 202111349816.1.
The second Office Action dated Aug. 24, 2022 from National Intellectual Property Administration, PRC for CN Application No. 202111349816.1.
The third Office Action dated Dec. 26, 2022 from National Intellectual Property Administration, PRC for CN Application No. 202111349816.1.
Request for the Submission of an Opinion dated Mar. 28, 2024 for Korean Application No. 10-2022-7046131.
Russian Office Action dated Jul. 4, 2023 regarding Application No. 2023100727/05(001428).
Extended European Search Report dated Dec. 15, 2023 regarding Application No. 22834836.3.
Decision to Grant a Patent dated Jul. 16, 2024 for Japanese Patent Application No. 2022-580948.
"Specially developed for the production of silicon carbide crystals by means of physical vapor transport" PVA Crystal Growing Systems GmbH, Jun. 15, 2021.
Communication pursuant to Article 94(3) EPC dated Mar. 25, 2025 regarding European Application No. 22834836.3.

* cited by examiner

APPARATUS FOR SYNCHRONOUS GROWTH OF SILICON CARBIDE CRYSTALS IN MULTIPLE INDEPENDENT CRUCIBLES ARRANGED LINEARLY

CROSS REFERENCE TO RELATED APPLICATION

The present application is a continuation of International application No. PCT/CN2022/124446, filed on Oct. 10, 2022, which claims priority of the Chinese patent application 202111349816.1, filed on Nov. 15, 2021, both of which are incorporated herein by reference in their entireties.

TECHNICAL FIELD

The present application relates to a method and apparatus for synchronous growth of silicon carbide crystals in multiple crucibles and belongs to the technical field of silicon carbide crystals.

BACKGROUND

Silicon carbide crystals are a $3^{rd}$ generation wide bandgap semiconductor material with excellent performances. It is characterized by a wide band gap, high carrier saturation concentration, high critical breakdown electric field, high thermal conductivity, and high chemical stability and thus is the best material for preparing integrated electronic devices having a high-frequency, high-power, high-density, high-temperature, radiation resistance and others. However, due to harsh growth conditions, slow growth speed and high growth cost of silicon carbide crystals, silicon carbide crystals can only be used in electronic components with high additional value.

The growth of silicon carbide crystals in an industrial scale mainly adopts a physical vapor transport (PVT) method. The method comprises the steps of heating silicon carbide raw materials contained in a graphite crucible at a temperature of above 2100° C. for sublimation, decomposing and transporting the gas generated to locations having a seed crystal for recrystallization, so as to obtain silicon carbide (SiC) single crystals with a large area.

At present, the PVT method involving induction heating is widely used in industry for the growth of silicon carbide crystals. An induction coil makes a graphite crucible generate an eddy current to directly heat up. The eddy current is mainly concentrated on the surface of the graphite crucible, resulting in a large radial gradient of temperature in the crucible. As a result, the radial gradient of temperature in the crucible is large during crystal growth, which causes crystals to crack due to excessive internal stress. Especially for the growth of large crystals, the yield of crystals in the course of growth is low. In addition, a traditional PVT growth device is to install a crucible in a cavity, and only one silicon carbide crystal can be grown in a certain period. However, due to the characteristics of high silicon carbide crystal growth temperature, slow growth rate, expensive equipment, and the like, the cost of silicon carbide crystals for growth is far higher than the cost of silicon crystals, which largely limits application of silicon carbide crystals.

SUMMARY

In view of the shortcomings of related technologies, one of objects of the present application is to provide a method and apparatus for synchronous growth of silicon carbide crystals in multiple crucibles solve the problems in the above background technologies.

In order to achieve the first object above, an apparatus for synchronous growth of silicon carbide crystals in multiple crucibles is provided and the present application is realized by the following technical solution.

An apparatus for synchronous growth of silicon carbide crystals in multiple crucibles comprises a chamber and an insulation layer assembly arranged close to inner walls of the chamber wherein a plurality of heater components are arranged at intervals inside the insulation layer assembly, by which the chamber is divided into a plurality of independent growth cavities, and each of the growth cavities is provided with an independent growth assembly; and wherein the independent growth assembly comprises a graphite crucible and a seed crystal tray arranged on the top of the graphite crucible. With such a setting, the inside of the chamber is completely surrounded by the thermal insulation layer assembly, and the internal space surrounded by the insulation layer assembly is divided into a plurality of independent growth cavities that do not interfere with each other by the plurality of heater components arranged at intervals inside the insulation layer assembly, which can realize synchronous growth of silicon carbide crystals and improve growth efficiency of silicon carbide crystals.

Optionally, the growth cavity has a circular horizontal cross section.

Optionally, the growth cavity has a symmetrically polygonal horizontal cross section, with a number of sides of ≥4.

Optionally, the graphite crucible is connected with a drive assembly at the bottom thereof, and the drive assembly is used to drive the graphite crucible to move in its growth cavity.

Optionally, the drive assembly comprises a lifting mechanism and a rotating mechanism. The lifting mechanism comprises a hollow lifting rod connected to the bottom of graphite crucible in a sliding way and a lifting motor fixed at the bottom of the chamber and connected with the bottom end of the hollow lifting rod. The rotating mechanism comprises a stepping motor fixed inside the hollow lifting rod, and a rotating rod coaxial and fixedly connected with an output shaft of the stepping motor, with the rotating rod being fixedly connected with the bottom of the graphite crucible. The rotating mechanism is set inside the lifting mechanism, and they do not interfere with each other when they work so as to ensure accuracy of the drive assembly in adjusting the position of the graphite crucible and ensure that it is simple and convenient to adjust the height and angle of the graphite crucible independently.

Optionally, the hollow lifting rod penetrates through the bottom of the chamber.

Optionally, the graphite crucible is provided with an annular chute at the bottom end thereof, and the hollow lifting rod is provided with a sliding roller matching the annular chute on the top end thereof.

Optionally, the heater components comprise a first heater and a second heater arranged around the periphery of the graphite crucible and a third heater fixed at the bottom of the graphite crucible.

Optionally, the graphite crucible is defined as have a height of M, the first heater and the second heater are arranged around the periphery of the graphite crucible in which the first heater is arranged at the position from the upper edge of the graphite crucible to a height of ¼M from the upper edge of the graphite crucible, the second heater is arranged at the position from the lower edge of the graphite crucible to a height of ¾M from the upper edge of the graphite crucible and the second heater has a height that does not exceed the height of silicon carbide raw materials.

In order to achieve the second object above, a method for synchronous growth of silicon carbide crystals in multiple crucibles is provided and the present application is realized by the following technical solution.

A method for synchronous growth of silicon carbide crystals in multiple crucibles adopts the above apparatus for synchronous growth of silicon carbide crystals and comprises the steps of S1. Preheating Phase in which after installing a graphite crucible, a drive assembly and silicon carbide raw materials, check air tightness of the chamber, vacuumize until the pressure inside the chamber is within 0.1–5 Pa, further vacuumize until the pressure inside the chamber is within $10^{-2}$–$10^{-5}$ Pa, increase power of the heater components to make the temperature inside the chamber reach 500-700° C., fill the chamber with a mixed gas including nitrogen/hydrogen and an inert gas, adjust the pressure inside the chamber to maintain it within the range of 10000-70000 Pa after the temperature inside the chamber is detected to be higher than 1500° C., and further increase power of the heater components to make the temperature of the graphite crucible reach 2100° C.;

S2. Crystallization Stage in which adjust the ratio of power of the heater components so that the temperature at the bottom of the graphite crucible is 10-100° C. higher than the temperature at the top of the graphite crucible, adjust the position of the graphite crucible through the drive assembly so that the temperature of the silicon carbide raw material in the graphite crucible is 15-80° C. higher than the temperature of the seed crystal and lower the pressure inside the chamber to maintain it within the range of 50-2500 Pa for a crystal growth stage;

S3. Finishing Stage in which after the crystal growth stage is complete, adjust the pressure inside the chamber to maintain it within 2500-10000 Pa, reduce the power of the heater components so as to reduce the temperature difference between the bottom of the graphite crucible and the top of the graphite crucible within 20° C., and further reduce the power of the heater components slowly until the power is 0.

In order to achieve the first object above, an apparatus for synchronous growth of silicon carbide crystals in multiple crucibles is provided and the present application is realized by the following technical solution.

An apparatus for synchronous growth of silicon carbide crystals in multiple crucibles comprises a chamber and an insulation layer assembly arranged close to inner walls of the chamber wherein the insulation layer assembly is used to divide the chamber into a plurality of independent growth cavities, and each of the growth cavities is provided with an independent growth assembly; and wherein the independent growth assembly comprises a graphite crucible, a seed crystal tray arranged on the top of the graphite crucible and heater components arranged around the periphery of the graphite crucible. With such a setting, the chamber inside is completely surrounded by the thermal insulation layer assembly, and is divided into a plurality of independent growth cavities that do not interfere with each other by the thermal insulation layer assembly, which can realize synchronous growth of silicon carbide crystals and improve growth efficiency of silicon carbide crystals.

Optionally, the growth cavity has a circular horizontal cross section.

Optionally, the growth cavity has a symmetrically polygonal horizontal cross section, with a number of sides of ≥4.

Optionally, the graphite crucible is connected with a drive assembly at the bottom thereof, and the drive assembly is used to drive the graphite crucible to move in its growth cavity.

Optionally, the drive assembly comprises a lifting mechanism and a rotating mechanism. The lifting mechanism comprises a hollow lifting rod connected to the bottom of graphite crucible in a sliding way and a lifting motor fixed at the bottom of the chamber and connected with the bottom end of the hollow lifting rod. The rotating mechanism comprises a stepping motor fixed inside the hollow lifting rod, and a rotating rod coaxial and fixedly connected with an output shaft of the stepping motor, with the rotating rod being fixedly connected with the bottom of the graphite crucible. The rotating mechanism is set inside the lifting mechanism, and they do not interfere with each other when they work so as to ensure accuracy of the drive assembly in adjusting the position of the graphite crucible and ensure that it is simple and convenient to adjust the height and angle of the graphite crucible independently.

Optionally, the hollow lifting rod penetrates through the bottom of the chamber.

Optionally, the graphite crucible is provided with an annular chute at the bottom end thereof, and the hollow lifting rod is provided with a sliding roller matching the annular chute on the top end thereof.

Optionally, the heater components comprise a first heater and a second heater arranged around the periphery of the graphite crucible and a third heater fixed at the bottom of the graphite crucible.

Optionally, the graphite crucible is defined as have a height of M, the first heater and the second heater are arranged around the periphery of the graphite crucible in which the first heater is arranged at the position from the upper edge of the graphite crucible to a height of ¼M from the upper edge of the graphite crucible, the second heater is arranged at the position from the lower edge of the graphite crucible to a height of ¾M from the upper edge of the graphite crucible and the second heater has a height that does not exceed the height of silicon carbide raw materials.

BENEFICIAL EFFECTS OF THE APPLICATION (1) The application relates to an apparatus for synchronous growth of silicon carbide crystals in multiple crucibles, in which a multi segment independently controlled graphite heater is used to replace a traditional induction heating method for heating, and which can more accurately adjust the radial and longitudinal temperature gradient of the crucible, thereby accelerating the growth rate of the crystals, and reducing the internal stress of the crystals.

(2) The application relates to an apparatus for synchronous growth of silicon carbide crystals in multiple crucibles, in which each crucible is located in an independent space, and a crystal growth environment similar to the traditional single crucible equipment is formed, thereby avoiding mutual interference of different crystals in their growth process, and ensuring that quality of the crystals is not lower than that of the crystals obtained by a single crucible growth.

(3) The application relates to an apparatus for synchronous growth of silicon carbide crystals in multiple crucibles, in which each crucible is equipped with an independent lifting and rotating mechanism, which can more accurately adjust the radial and longitudinal temperature gradient for each crucible, and can also adjust separate crucibles to have different temperature gradients, thereby speeding up the research and development of crystal growth process and reducing the research and development cost.

(4) The application relates to an apparatus for synchronous growth of silicon carbide crystals in multiple crucibles, in which the heater components comprise a first heater, a second heater and a third heater independently arranged without mutual interference, the second heater and the third heater are used to adjust the temperature of silicon carbide raw materials, and particularly the second heater can ensure that the silicon carbide raw material can be adjusted to reach the desired temperature and to avoid the influence on the silicon carbide seed crystal in the seed crystal tray, so that the purpose of controlling the temperatures of the silicon carbide raw material and silicon carbide seed crystal respectively is achieved.

(5) The application relates to a method for synchronous growth of silicon carbide crystals in multiple crucibles, in which different crucibles can be used to the growth of silicon carbide crystals of different diameters. For example, 4-inch, 6-inch and 8-inch crystals can be grown synchronously in one apparatus to meet the needs of production tasks.

(6) The application relates to a method for synchronous growth of silicon carbide crystals in multiple crucibles, in which a plurality of crucibles can be used for synchronous growth, and a plurality of crystals can be grown in one furnace, thereby greatly improving productivity of a single furnace, reducing the energy, equipment and personnel costs of unit products, and narrowing the cost gap with single crystal silicon, which can not only significantly reduce the growth cost of silicon carbide crystals, but also ensure the internal quality of single crystal ingots, and expand the application field of silicon carbide crystals.

DESCRIPTION OF DRAWINGS

With reference to the following drawings, the non-limiting embodiments are descripted detailed and other features, purposes and advantages of the present application will become more apparent.

In the above figures: 1 chamber, 2 growth cavity, 3 graphite crucible, 4 seed crystal tray, 5 lifting mechanism, 6 rotating mechanism, 7 hollow lifting rod, 8 lifting motor, 9 annular chute, 10 sliding roller, 11 stepping motor, 12 rotary rod, 13 first heater, 14 second heater, 15 third heater, 16 first insulation layer, 17 second insulation layer, 18 third insulation layer, 19 first electrode, 20 second electrode, 21 third electrode, 22 silicon carbide raw material, 23 silicon carbide seed crystal.

DETAILED EMBODIMENTS

In order to understand the technical means, creative features, objectives and effects achieved by the application easily, the application is further elaborated in combination with specific embodiments.

Example 1

Figure 1:
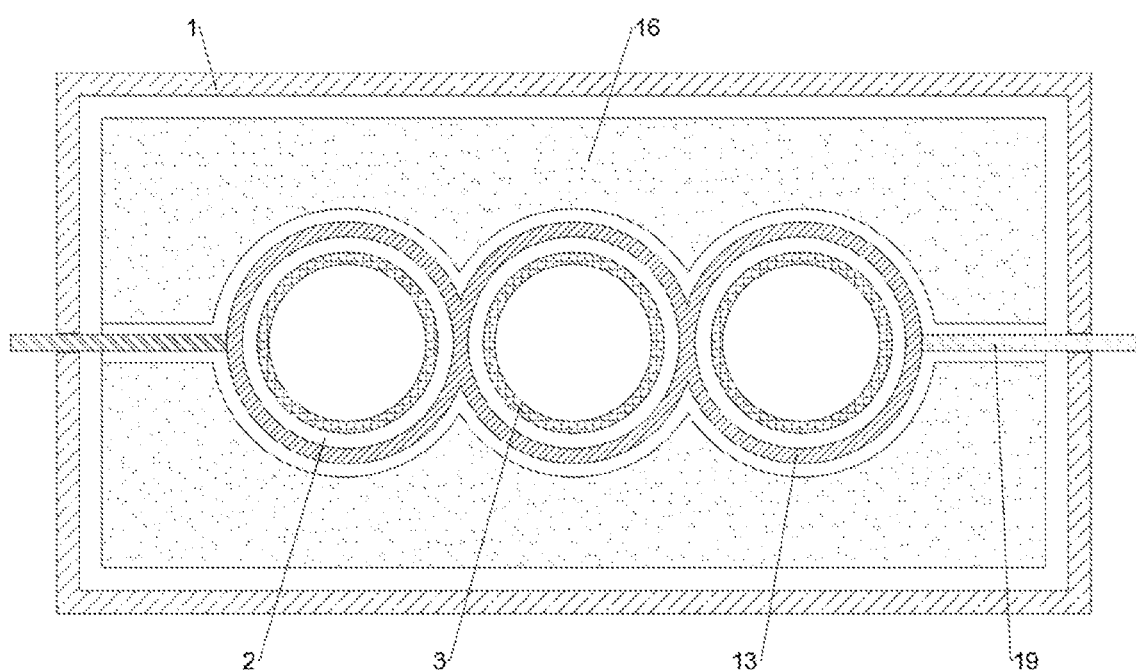
FIG. 1 is a top structure schematic view of an apparatus for synchronous growth of silicon carbide crystals in multiple crucibles according to an embodiment of the present application.
Figure 2:
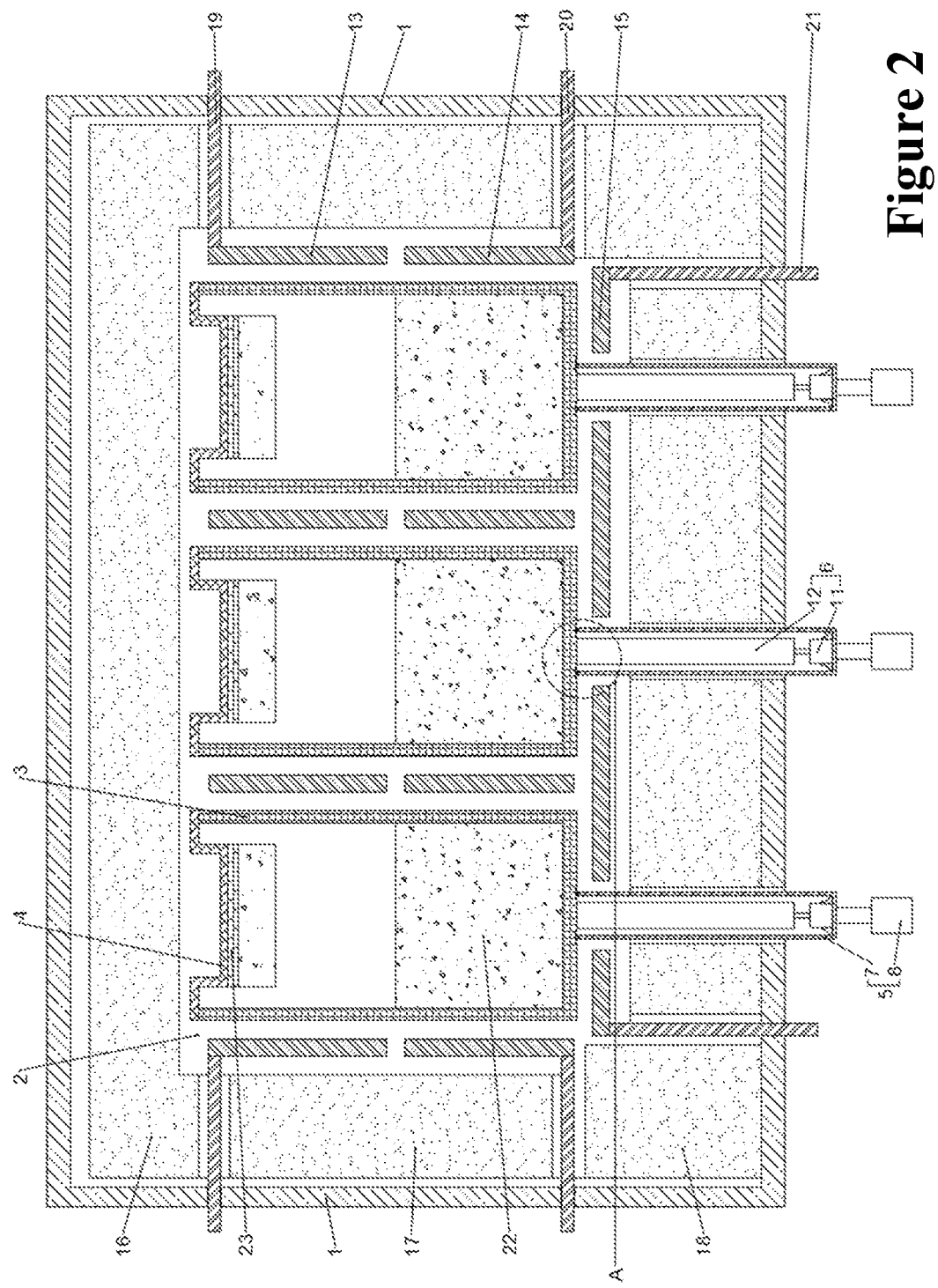
FIG. 2 is a front structure schematic view of an apparatus for synchronous growth of silicon carbide crystals in multiple crucibles according to an embodiment of the present application.

As shown in FIGS. 1 and 2, an apparatus for synchronous growth of silicon carbide crystals in multiple crucibles is provided, which comprises a chamber 1 and an insulation layer assembly arranged close to inner walls of the chamber wherein the insulation layer assembly comprises a first insulation layer 16, a second insulation layer 17 and a third insulation layer 18 that are close to inner walls of the chamber from top to bottom; a plurality of heater components are arranged at intervals inside the insulation layer assembly, by which the chamber is divided into a plurality of independent growth cavities 2, and each of the growth cavities 2 is provided with an independent growth assembly; and wherein the independent growth assembly comprises a graphite crucible 3, a seed crystal tray 4 arranged on the top of the graphite crucible 3 and a drive assembly arranged at the bottom of the graphite crucible 3; the heater components comprise a first heater 13 and a second heater 14 arranged around the periphery of the graphite crucible 3 and a third heater 15 fixed at the bottom of the graphite crucible 3. The graphite crucible 3 is defined as have a height of M. In this embodiment, the silicon carbide raw material is loaded to ½M of the height of the graphite crucible 3. The first heater 13 and the second heater 14 are arranged around the periphery of the graphite crucible 3 in which the first heater 13 is arranged at the position from the upper edge of the graphite crucible 3 to a height of ½M from the upper edge of the graphite crucible 3, the second heater 14 is arranged at the position from the lower edge of the graphite crucible 3 to a height of ½M from the upper edge of the graphite crucible 3 and the second heater 14 has a height that does not exceed the height of silicon carbide raw materials. A first electrode 19 is fixed on each first heater 13, a second electrode 20 is fixed on each second heater 14, and a third electrode 21 is fixed on each third heater 15. The first electrode 19, the second electrode 20 and the third electrode 21 extend to the outside of the chamber 1 and are electrically connected with a controller. Accordingly, the first electrode 19 is embedded between the first insulation layer 16 and the second insulation layer 17, the second electrode 20 is embedded between the second insulating layer 17 and the third insulating layer 18, and the third electrode 21 penetrates through the third insulating layer 18.

In this example, the growth cavity 2 has a circular horizontal cross section.

The graphite crucible 3 is connected with a drive assembly at the bottom thereof, and the drive assembly is used to drive the graphite crucible to move in its growth cavity 2.

Figure 3:
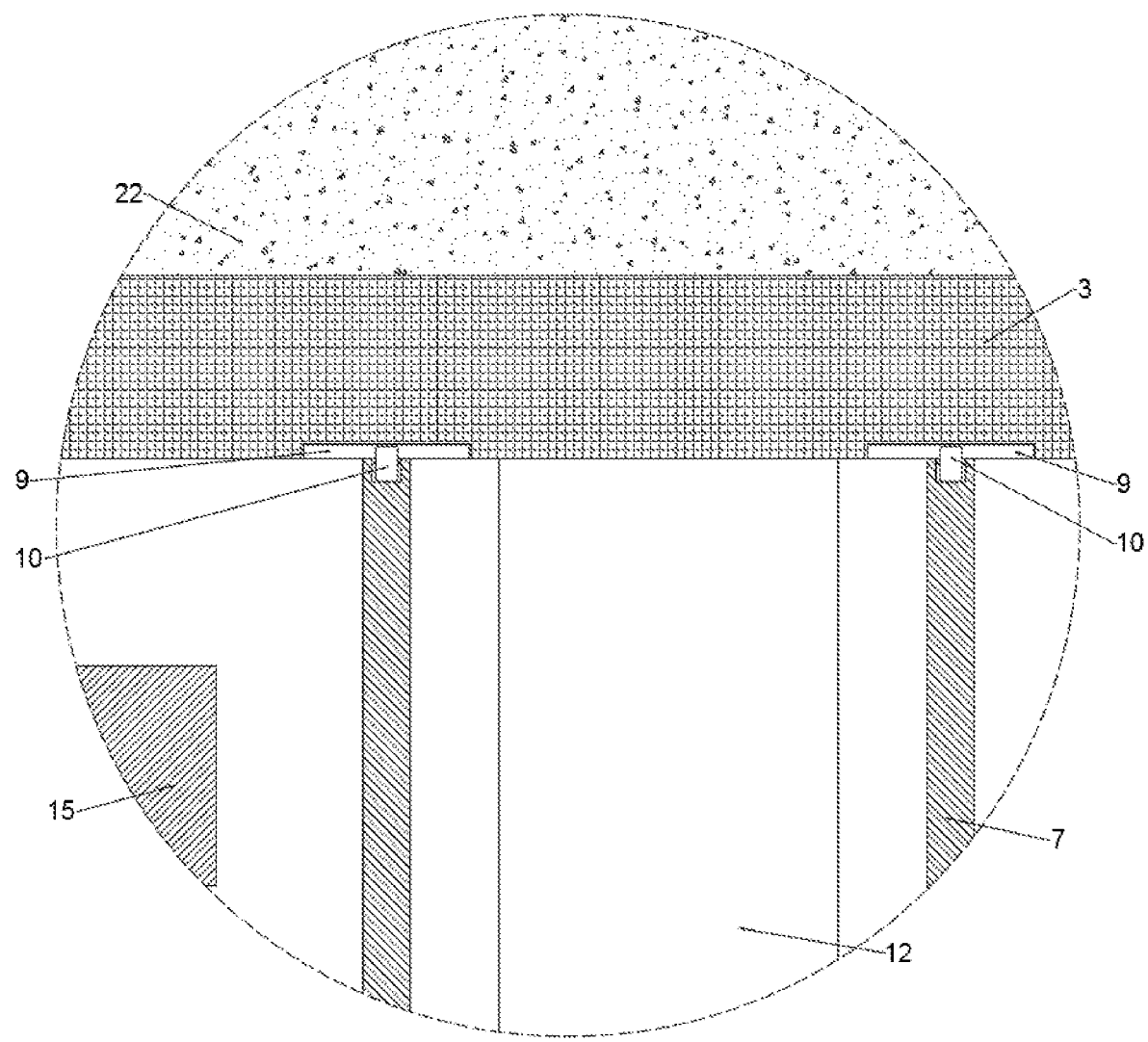
FIG. 3 is an enlarged schematic view of A in FIG. 2 of the present application.

The drive assembly comprises a lifting mechanism 5 and a rotating mechanism 6. The lifting mechanism 5 comprises a hollow lifting rod 7 connected to the bottom of graphite crucible 3 in a sliding way, and a lifting motor 8 fixed at the bottom of the chamber 1 and connected with the bottom end of the hollow lifting rod 7 and the hollow lifting rod 7 penetrates through the bottom of the chamber 1. In combination with FIG. 3, the graphite crucible 3 is provided with an annular chute 9 at the bottom end thereof, and the hollow lifting rod 7 is provided with a sliding roller 10 matching the annular chute 9 on the top end thereof. The rotating mechanism 6 comprises a stepping motor 11 fixed inside the hollow lifting rod 7, and a rotating rod 12 coaxial and fixedly connected with an output shaft of the stepping motor 11, and the rotating rod 12 is fixedly connected with the bottom of the graphite crucible 3.

To sum up, the working principle and operation process of the present application is as follows. Fill the graphite crucible 3 within each growth cavity 2 with silicon carbide raw material 22, and fix a silicon carbide seed 23 on the seed crystal tray 4. Check air tightness of the chamber 1, vacuumize and heat until the chamber 1 and the graphite crucible 3 reach the desired pressure and temperature. Synchronous growth of silicon carbide crystals performs. During the growth process, separately adjust the heater components and the lifting mechanism 5 and rotating mechanism 6 within each separate growth assembly, and adjust the temperature of the graphite crucible 3 and its position in the growth cavity 2.

Example 2

Example 2 is the same as example 1 with the exception that the growth cavity has an octagonal horizontal cross section.

Example 3

A method for synchronous growth of silicon carbide crystals in multiple crucibles adopts the above apparatus of example 1 for synchronous growth of silicon carbide crystals and comprises the steps of
S1. Preheating Phase
After installing a graphite crucible 3, a drive assembly and silicon carbide raw materials, check air tightness of the chamber 1, vacuumize until the pressure inside the chamber 1 is about 5 Pa, further vacuumize until the pressure inside the chamber is about $10^{-5}$ Pa. The existing molecular pump or dry vortex pump can be used as a pump body for vacuum pumping. The pump body is connected to the chamber 1 through a vacuum pipe (not shown in the figure). Turn on a rotating motor fixed at the bottom of the synchronous growth equipment. Increase power of the heater components to make the temperature inside the chamber reach 500° C., fill the chamber 1 with a mixed gas including nitrogen and argon, adjust the pressure inside the chamber 1 to maintain it at about 10000 Pa, and further increase power of the heater components to make the temperature of graphite crucible 3 reach 2100° C.;
S2. Crystallization Stage
Adjust the ratio of power of the heater components so that the temperature at the bottom of the graphite crucible 3 is 10° C. higher than the temperature at the top of the graphite crucible 3, adjust the position of the graphite crucible 3 through the drive assembly so that the temperature of the silicon carbide raw material in the graphite crucible 3 is 15° C. higher than the temperature of the seed crystal and lower the pressure inside the chamber 1 to maintain it at about 50 Pa for a crystal growth stage of conductive silicon carbide crystals;
S3. Finishing Stage
After the crystal growth stage is complete, adjust the pressure inside the chamber 1 to maintain it at about 10000 Pa, reduce the power of the heater components so as to reduce the temperature difference between the bottom of the graphite crucible 3 and the top of the graphite crucible 3 to within 20° C., and further reduce the power of the heater components slowly until the power is 0.

Example 4

A method for synchronous growth of silicon carbide crystals in multiple crucibles adopts the above apparatus of example 2 for synchronous growth of silicon carbide crystals, which method has the exception that the growth cavity 2 has a different horizontal cross section.

Example 5

A method for synchronous growth of silicon carbide crystals in multiple crucibles adopts the above apparatus of example 1 for synchronous growth of silicon carbide crystals, which method is the same as example 3 with the exception that in step S1, a mixed gas of hydrogen and argon is filled to grow semi-insulating silicon carbide crystals.

Example 6

A method for synchronous growth of silicon carbide crystals in multiple crucibles is provided, in which in step S1, a mixed gas of hydrogen and argon is filled to grow semi-insulating silicon carbide crystals. Example 6 is different from example 5 in that it adopts the above apparatus of example 2 for synchronous growth of silicon carbide crystals, and the growth cavity 2 has an octagonal horizontal cross section.

Example 7

Figure 4:
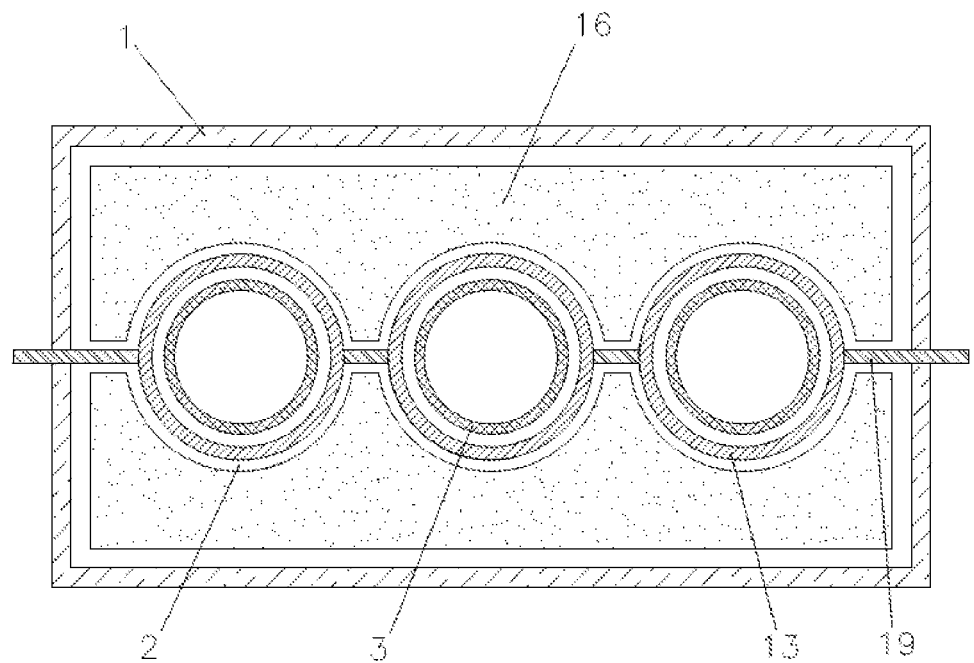
FIG. 4 is a top structure schematic view of an apparatus for synchronous growth of silicon carbide crystals in multiple crucibles according to another embodiment of the present application.
Figure 5:
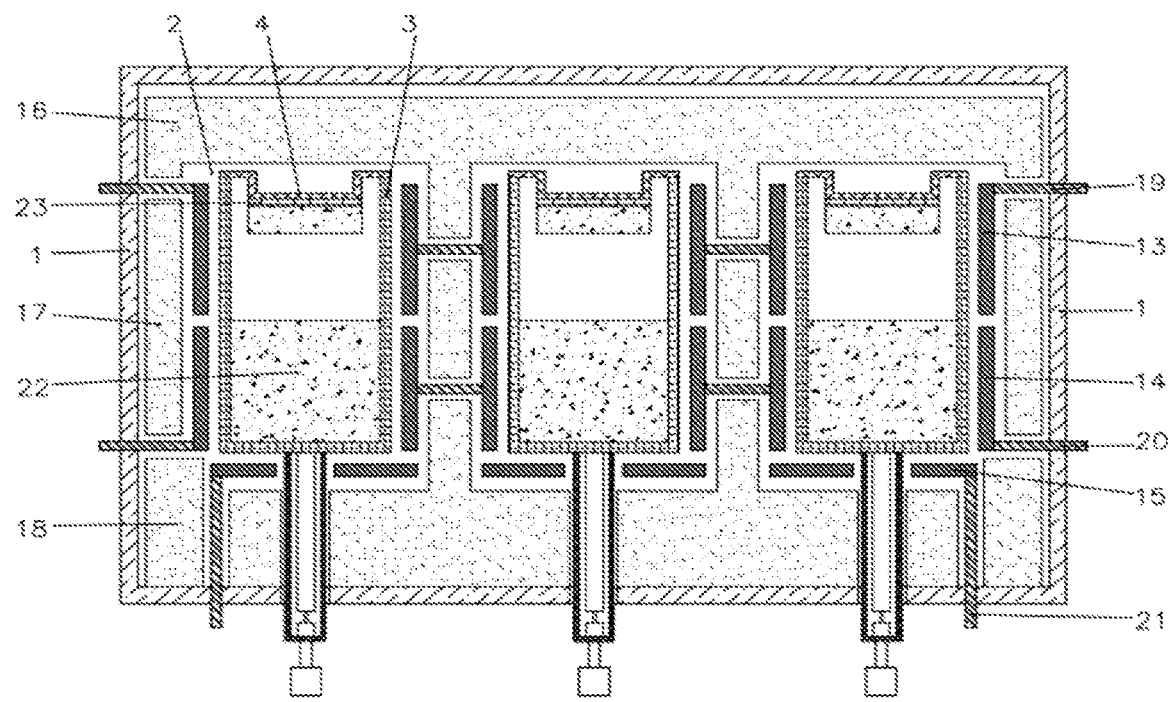
FIG. 5 is a front structure schematic view of an apparatus for synchronous growth of silicon carbide crystals in multiple crucibles according to another embodiment of the present application.

As shown in FIGS. 4 and 5, an apparatus for synchronous growth of silicon carbide crystals in multiple crucibles comprises a chamber 1 and an insulation layer assembly arranged close to inner walls of the chamber 1 wherein the insulation layer assembly comprises a first insulation layer 16, a second insulation layer 17 and a third insulation layer 18 that are close to inner walls of the chamber from top to bottom; the insulation layer assembly is used to divide the chamber 1 into a plurality of independent growth cavities 2, and each of the growth cavities 2 is provided with an independent growth assembly; and wherein the independent growth assembly comprises a graphite crucible 3, a seed crystal tray 4 arranged on the top of the graphite crucible 3, heater components arranged around the periphery of the graphite crucible 3, and a drive assembly arranged at the bottom of the graphite crucible 3. The heater components comprises a first heater 13 and a second heater 14 arranged around the periphery of the graphite crucible 3 and a third heater 15 fixed at the bottom of the graphite crucible 3. The graphite crucible 3 is defined as have a height of M. In this embodiment, the silicon carbide raw material is loaded to ½M of the height of the graphite crucible 3. The first heater 13 and the second heater 14 are arranged around the periphery of the graphite crucible 3 in which the first heater 13 is arranged at the position from the upper edge of the graphite crucible 3 to a height of ½M from the upper edge of the graphite crucible 3, the second heater 14 is arranged at the position from the lower edge of the graphite crucible 3 to a height of ½M from the upper edge of the graphite crucible 3 and the second heater 14 has a height that does not exceed the height of silicon carbide raw materials. A first electrode 19 is fixed on each first heater 13, a second electrode 20 is fixed on each second heater 14, and a third electrode 21 is fixed on each third heater 15. The first electrode 19, the second electrode 20 and the third electrode 21 extend to the outside of the chamber 1 and are electrically connected with a controller. Accordingly, the first electrode 19 is embedded between the first insulation layer 16 and the second insulation layer 17, the second electrode 20 is embedded between the second insulating layer 17 and the third insulating layer 18, and the third electrode 21 penetrates through the third insulating layer 18.

In this example, the growth cavity 2 has a circular horizontal cross section.

The graphite crucible 3 is connected with a drive assembly at the bottom thereof, and the drive assembly is used to drive the graphite crucible to move in the growth cavity 2.

The drive assembly comprises a lifting mechanism 5 and a rotating mechanism 6. The lifting mechanism 5 comprises a hollow lifting rod 7 connected to the bottom of graphite crucible 3 in a sliding way and a lifting motor 8 fixed at the bottom of the chamber 1 and connected with the bottom end of the hollow lifting rod 7 and the hollow lifting rod 7 penetrates through the bottom of the chamber 1. In combination with FIG. 3, the graphite crucible 3 is provided with an annular chute 9 at the bottom end thereof, and the hollow lifting rod 7 is provided with a sliding roller 10 matching the annular chute 9 on the top end thereof. The rotating mechanism 6 comprises a stepping motor 11 fixed inside the hollow lifting rod 7, and a rotating rod 12 coaxial and fixedly connected with an output shaft of the stepping motor 11, with the rotating rod 12 being fixedly connected with the bottom of the graphite crucible 3.

To sum up, the working principle and operation process of the present application is as follows. Fill the graphite crucible 3 within each of growth cavities 2 with silicon carbide raw materials 22, and fix a silicon carbide seed 23 on the seed crystal tray 4. Check air tightness of the chamber 1, vacuumize and heat until the chamber 1 and the graphite crucible 3 reach the desired pressure and temperature. Synchronous growth of silicon carbide crystals performs. During the growth process, separately adjust the heater components and the lifting mechanism 5 and rotating mechanism 6 of each independent growth assembly, and adjust the temperature of the graphite crucible 3 and its position in the growth cavity 2.

Comparative Example 1

The single crystal growth device and its growth method as described in the Chinese application No. CN110129880A were adopted.

Comparative Example 2

The single crystal growth device and its growth method as described in the Chinese application No. CN104364428A were adopted.

Test Result 1

The test result 1 was used to show the growth of silicon carbide crystals that were obtained by observation and statistics with the growth method of examples 3-6 as compared with the single crystal growth device and growth method of comparative examples 1 and 2.
  ○ represents a high growth efficiency of silicon carbide crystal; □ represents a fair growth efficiency of silicon carbide crystal; and x represents a poor growth efficiency of silicon carbide crystal.

Test Result 2

The test result 2 was used to show the morphologies of silicon carbide crystals that were obtained by observation and statistics with the growth method of examples 3-6 as compared with the single crystal growth device and growth method of comparative examples 1 and 2.
  ○ represents that the silicon carbide crystal had an integral morphology and its surface was smooth;
  □ represents that the silicon carbide crystal had an integral morphology and there was cracks on the surface; and x represents that the silicon carbide crystal had a poor morphology.

The above results were summarized in table as shown below.

TABLE 1

|  | Test result 1 | Test result 2 |
| --- | --- | --- |
| Example 3 | ○ | ○ |
| Example 4 | ○ | ○ |
| Example 5 | ○ | ○ |
| Example 6 | ○ | ○ |
| Comparataive Example 1 | x | □ |
| Comparataive Example 2 | □ | x |

By comparing the test results in Examples 3 to 6, it can be seen that the silicon carbide single crystals prepared by this growth apparatus and method are more smooth and clean in surface, lower in internal stress, significantly reduced in crack ratio, and significantly improved in yield of crystals compared with silicon carbide single crystals grown by the existing common methods.

Here are some other embodiments of the present application.

Embodiment 1. An apparatus for synchronous growth of silicon carbide crystals in multiple crucibles comprises a chamber (1) and an insulation layer assembly arranged close to inner walls of the chamber (1)
  wherein a plurality of heater components are arranged at intervals inside the insulation layer assembly, by which the chamber is divided into a plurality of independent growth cavities (2), and each of the growth cavities (2) is provided with an independent growth assembly; and
  wherein the independent growth assembly comprises a graphite crucible (3) and a seed crystal tray (4) arranged on the top of the graphite crucible (3).

Embodiment 2. The apparatus according to Embodiment 1, wherein the growth cavity has a circular horizontal cross section.

Embodiment 3. The apparatus according to Embodiment 1, wherein the growth cavity has a symmetrically polygonal horizontal cross section, with a number of sides of ≥4.

Embodiment 4. The apparatus according to Embodiment 2 or 3, wherein the graphite crucible (3) is connected with a drive assembly at the bottom thereof, and the drive assembly is used to drive the graphite crucible (3) to move in its growth cavity (2).

Embodiment 5. The apparatus according to Embodiment 4, wherein the drive assembly comprises a lifting mechanism (5) and a rotating mechanism (6);
  the lifting mechanism (5) comprises a hollow lifting rod (7) connected to the bottom of graphite crucible (3) in a sliding way and a lifting motor (8) fixed at the bottom of the chamber (1) and connected with the bottom end of the hollow lifting rod (7); and the rotating mechanism (6) comprises a stepping motor (11) fixed inside the hollow lifting rod (7) and a rotating rod (12) coaxial and fixedly connected with an output shaft of the stepping motor (11), with the rotating rod (12) being fixedly connected with the bottom of the graphite crucible (3).

Embodiment 6. The apparatus according to Embodiment 5, wherein the hollow lifting rod (12) penetrates through the bottom of the chamber (1).

Embodiment 7. The apparatus according to Embodiment 5, wherein the graphite crucible (3) is provided with an annular chute (9) at the bottom end thereof, and the hollow lifting rod (7) is provided with a sliding roller (10) matching the annular chute (9) on the top end thereof.

Embodiment 8. The apparatus according to Embodiment 6 or 7, wherein the heater components comprises a first heater (13) and a second heater (14) arranged around the periphery of the graphite crucible (3) and a third heater (15) fixed at the bottom of the graphite crucible (3).

Embodiment 9. The apparatus according to Embodiment 8, wherein the graphite crucible (3) is defined as have a height of M, the first heater (13) and the second heater (14) are arranged around the periphery of the graphite crucible (3) in which the first heater (13) is arranged at the position from the upper edge of the graphite crucible (3) to a height of ¼M from the upper edge of the graphite crucible (3), the second heater (14) is arranged at the position from the lower edge of the graphite crucible (3) to a height of ¾M from the upper edge of the graphite crucible (3) and the second heater (14) has a height that does not exceed the height of silicon carbide raw materials.

Embodiment 10. A method for synchronous growth of silicon carbide crystals in multiple crucibles, adopting the apparatus for synchronous growth of silicon carbide crystals according to any one of claims 4 to 9, comprising the steps of S1. Preheating Phase
  in which after installing a graphite crucible (3), a drive assembly and silicon carbide raw materials, check air tightness of the chamber (1), vacuumize until the pressure inside the chamber (1) is within 0.1-5 Pa, further vacuumize until the pressure inside the chamber (1) is within $10^{-2}$-$10^{-5}$ Pa, increase power of the heater components to make the temperature inside the chamber (1) reach 500-700° C., fill the chamber (1) with a mixed gas including nitrogen/hydrogen and an inert gas, adjust the pressure inside the chamber (1) to maintain it within the range of 10000-70000 Pa after the temperature inside the chamber (1) is detected to be higher than 1500° C., and further increase power of the heater components to make the temperature of the graphite crucible (3) reach 2000° C.;

S2. Crystallization Stage
  In which adjust the ratio of power of the heater components so that the temperature at the bottom of the graphite crucible (3) is 10-100° C. higher than the temperature at the top of the graphite crucible (3), adjust the position of the graphite crucible (3) through the drive assembly so that the temperature of the silicon carbide raw materials in the graphite crucible (3) is 15-80° C. higher than the temperature of the seed crystal and lower the pressure inside the chamber (1) to maintain it within the range of 50-2500 Pa for a crystal growth stage;

S3. Finishing Stage
  In which after the crystal growth stage is complete, adjust the pressure inside the chamber (1) to maintain it within 2500-10000 Pa, reduce the power of the heater components so as to reduce the temperature difference between the bottom of the graphite crucible (3) and the top of the graphite crucible (3) within 20° C., and further reduce the power of the heater components slowly until the power is 0.

Embodiment 11. An apparatus for synchronous growth of silicon carbide crystals in multiple crucibles comprising a chamber (1) and an insulation layer assembly arranged close to inner walls of the chamber (1)
  wherein the insulation layer assembly is used to divide the chamber (1) into a plurality of independent growth cavities (2), and each of the growth cavities (2) is provided with an independent growth assembly;
  wherein the independent growth assembly comprises a graphite crucible (3), a seed crystal tray (4) arranged on the top of the graphite crucible (3) and heater components arranged around the periphery of the graphite crucible (3).

Embodiment 12. The apparatus according to Embodiment 11, wherein the growth cavity (2) has a circular horizontal cross section.

Embodiment 13. The apparatus according to Embodiment 11, wherein the growth cavity (2) has a symmetrically polygonal horizontal cross section, with a number of sides of ≥4.

Embodiment 14. The apparatus according to Embodiment 12 or 13, wherein the graphite crucible (3) is connected with a drive assembly at the bottom thereof, and the drive assembly is used to drive the graphite crucible (3) to move in its growth cavity (2).

Embodiment 15. The apparatus according to Embodiment 14, wherein the drive assembly comprises a lifting mechanism (5) and a rotating mechanism (6);
  the lifting mechanism (5) comprises a hollow lifting rod (7) connected to the bottom of graphite crucible (3) in a sliding way and a lifting motor (8) fixed at the bottom of the chamber (1) and connected with the bottom end of the hollow lifting rod (7); and
  the rotating mechanism (6) comprises a stepping motor (11) fixed inside the hollow lifting rod (7) and a rotating rod (12) coaxial and fixedly connected with an output shaft of the stepping motor (11), with the rotating rod (12) being fixedly connected with the bottom of the graphite crucible (3).

Embodiment 16. The apparatus according to Embodiment 15, wherein the hollow lifting rod (12) penetrates through the bottom of the chamber (1).

Embodiment 17. The apparatus according to Embodiment 15, wherein the graphite crucible (3) is provided with an annular chute (9) at the bottom end thereof, and the hollow lifting rod (7) is provided with a sliding roller (10) matching the annular chute (9) on the top end thereof.

Embodiment 18. The apparatus according to Embodiment 16 or 17, wherein the heater components comprise a first heater (13) and a second heater (14) arranged around the periphery of the graphite crucible (3) and a third heater (15) fixed at the bottom of the graphite crucible (3).

Embodiment 19. The apparatus according to Embodiment 18, wherein the graphite crucible (3) is defined as have a height of M, the first heater (13) and the second heater (14) are arranged around the periphery of the graphite crucible (3) in which the first heater (13) is arranged at the position from the upper edge of the graphite crucible (3) to a height of ¼M from the upper edge of the graphite crucible (3), the second heater (14) is arranged at the position from the lower edge of the graphite crucible (3) to a height of ¾M from the upper edge of the graphite crucible (3) and the second heater (14) has a height that does not exceed the height of silicon carbide raw materials.

The above shows and describes the basic principles and main features of the application and the advantages of the application. For those skilled in the art, it is obvious that the application is not limited to the details of the above exemplary embodiments, and the application can be realized in other specific forms without departing from the spirit or basic features of the application. Therefore, from any point of view, the embodiments should be regarded as exemplary and non-restrictive. The scope of the application is defined by the appended claims rather than the above description. Therefore, it is intended to include all changes within the meaning and scope of the equivalent elements of the claims in the application.

In addition, it should be understood that although the Description is described according to the embodiments, not every embodiment only contains an independent technical solution. This description of the Description is only for the sake of clarity. Those skilled in the art should take the Description as a whole, and the technical solutions in each embodiment can also be properly combined to form other embodiments that can be understood by those skilled in the art.

What is claimed is:

1. An apparatus for synchronous growth of silicon carbide crystals in multiple crucibles comprises a chamber and an insulation layer assembly arranged close to inner walls of the chamber,
   wherein a plurality of heater components are arranged at intervals inside the insulation layer assembly, by which the chamber is divided into a plurality of independent growth cavities that are linearly arranged, and each of the growth cavities is provided with an independent growth assembly,
   wherein the independent growth assembly comprises a graphite crucible and a seed crystal tray arranged on a top of the graphite crucible, and
   wherein:
   the graphite crucible is connected with a drive assembly at a bottom of the graphite crucible, and the drive assembly is used to drive the graphite crucible to move in its growth cavity;
   the drive assembly comprises a lifting mechanism and a rotating mechanism;
   the lifting mechanism comprises a hollow lifting rod connected to the bottom of the graphite crucible in a sliding way and a lifting motor fixed at a bottom of the chamber and connected with a bottom end of the hollow lifting rod; and
   the rotating mechanism comprises a stepping motor fixed inside the hollow lifting rod and a rotating rod coaxially and fixedly connected with an output shaft of the stepping motor, with the rotating rod being fixedly connected with the bottom of the graphite crucible.

2. The apparatus according to claim 1, wherein the growth cavity has a circular horizontal cross section.

3. The apparatus according to claim 1, wherein the growth cavity has a symmetrically polygonal horizontal cross section, with a number of sides of ≥4.

4. The apparatus according to claim 1, wherein the hollow lifting rod penetrates through the bottom of the chamber.

5. The apparatus according to claim 1, wherein the graphite crucible is provided with an annular chute at the bottom of the graphite crucible, and the hollow lifting rod is provided with a sliding roller matching the annular chute on a top end of the hollow lifting rod.

6. The apparatus according to claim 1, wherein the heater components comprise a first heater and a second heater arranged around a periphery of the graphite crucible and a third heater fixed at the bottom of the graphite crucible.

7. The apparatus according to claim 6, wherein the graphite crucible has a height of M, the first heater and the second heater are arranged around the periphery of the graphite crucible in which the first heater is extends from an upper edge of the graphite crucible to a height of ¼M from the upper edge of the graphite crucible, the second heater extends from a lower edge of the graphite crucible to a height of ¾M from the upper edge of the graphite crucible, and the second heater has a height that does not exceed a height of silicon carbide raw materials.

8. An apparatus for synchronous growth of silicon carbide crystals in multiple crucibles comprising a chamber and an insulation layer assembly arranged close to inner walls of the chamber,
   wherein the insulation layer assembly is used to divide the chamber into a plurality of independent growth cavities that are linearly arranged, and each of the growth cavities is provided with an independent growth assembly,
   wherein the independent growth assembly comprises a graphite crucible, a seed crystal tray arranged on a top of the graphite crucible and heater components arranged around a periphery of the graphite crucible, and
   wherein:
   the graphite crucible is connected with a drive assembly at a bottom of the graphite crucible, and the drive assembly is used to drive the graphite crucible to move in its growth cavity;
   the drive assembly comprises a lifting mechanism and a rotating mechanism;
   the lifting mechanism comprises a hollow lifting rod connected to the bottom of graphite crucible in a sliding way and a lifting motor fixed at a bottom of the chamber and connected with a bottom end of the hollow lifting rod; and
   the rotating mechanism comprises a stepping motor fixed inside the hollow lifting rod and a rotating rod coaxially and fixedly connected with an output shaft of the stepping motor, with the rotating rod being fixedly connected with the bottom of the graphite crucible.

9. The apparatus according to claim 8, wherein the growth cavity has a circular horizontal cross section.

10. The apparatus according to claim 8, wherein the growth cavity has a symmetrically polygonal horizontal cross section, with a number of sides of ≥4.

11. The apparatus according to claim 8, wherein the hollow lifting rod penetrates through the bottom of the chamber.

12. The apparatus according to claim 8, wherein the graphite crucible is provided with an annular chute at the bottom of the graphite crucible, and the hollow lifting rod is provided with a sliding roller matching the annular chute on a top end of the hollow lifting rod.

13. The apparatus according to claim 8, wherein the heater components comprise a first heater and a second heater arranged around the periphery of the graphite crucible and a third heater fixed at a bottom of the graphite crucible.

14. The apparatus according to claim 13, wherein the graphite crucible has a height of M, the first heater and the second heater are arranged around the periphery of the graphite crucible in which the first heater is extends from an upper edge of the graphite crucible to a height of ¼M from the upper edge of the graphite crucible, the second heater (14) extends from a lower edge of the graphite crucible to a height of ¾M from the upper edge of the graphite crucible, and the second heater has a height that does not exceed a height of silicon carbide raw materials.

15. The apparatus according to claim 1, wherein the heater components comprise a first heater that is a single continuous body and surrounds the plurality of graphite crucibles.

* * * * *